US012353133B2

(12) United States Patent
Serizawa et al.

(10) Patent No.: US 12,353,133 B2
(45) Date of Patent: Jul. 8, 2025

(54) SILICON-CONTAINING COMPOSITION AND METHOD OF PRODUCING SEMICONDUCTOR SUBSTRATE

(71) Applicant: JSR CORPORATION, Tokyo (JP)

(72) Inventors: Ryuichi Serizawa, Tokyo (JP); Kengo Hirasawa, Tokyo (JP)

(73) Assignee: JSR CORPORATION, Tokyo (JP)

( * ) Notice: Subject to any disclaimer, the term of this patent is extended or adjusted under 35 U.S.C. 154(b) by 256 days.

(21) Appl. No.: 17/887,670

(22) Filed: Aug. 15, 2022

(65) Prior Publication Data

US 2022/0403116 A1 Dec. 22, 2022
US 2023/0250238 A9 Aug. 10, 2023

Related U.S. Application Data

(63) Continuation of application No. PCT/JP2021/002615, filed on Jan. 26, 2021.

(30) Foreign Application Priority Data

Feb. 19, 2020 (JP) .................. 2020-026649

(51) Int. Cl.
| | |
|---|---|
| G03F 7/11 | (2006.01) |
| C08G 77/00 | (2006.01) |
| C08G 77/04 | (2006.01) |
| C08G 77/24 | (2006.01) |
| C08G 77/385 | (2006.01) |
| G03F 7/075 | (2006.01) |
| G03F 7/09 | (2006.01) |
| G03F 7/20 | (2006.01) |
| G03F 7/30 | (2006.01) |
| G03F 7/32 | (2006.01) |

(52) U.S. Cl.
CPC ............. *G03F 7/11* (2013.01); *C08G 77/00* (2013.01); *C08G 77/04* (2013.01); *C08G 77/24* (2013.01); *C08G 77/385* (2013.01); *C08G 77/80* (2013.01); *G03F 7/0757* (2013.01); *G03F 7/2004* (2013.01); *G03F 7/30* (2013.01); *G03F 7/327* (2013.01)

(58) Field of Classification Search
CPC ........... G03F 7/11; G03F 7/0757; G03F 7/30; G03F 7/094; C08G 77/00; C08G 77/04; C08G 77/24; C08G 77/80; C08G 77/385
See application file for complete search history.

(56) References Cited

U.S. PATENT DOCUMENTS

| | | | |
|---|---|---|---|
| 9,196,484 B2 | 11/2015 | Takeda et al. | |
| 9,291,900 B2 | 3/2016 | Kanno et al. | |
| 10,372,040 B2 | 8/2019 | Shibayama et al. | |
| 10,890,846 B2 * | 1/2021 | Na | ................. G03F 7/40 |
| 11,022,884 B2 | 6/2021 | Shibayama et al. | |
| 2005/0196699 A1 * | 9/2005 | Kanagasabapathy | ................. G03F 7/0757 430/270.1 |
| 2013/0183830 A1 | 7/2013 | Takeda et al. | |
| 2013/0302991 A1 | 11/2013 | Kanno et al. | |
| 2017/0168397 A1 | 6/2017 | Shibayama et al. | |
| 2017/0322491 A1 | 11/2017 | Shibayama et al. | |
| 2018/0314153 A1 * | 11/2018 | Na | ................. H10D 86/451 |

FOREIGN PATENT DOCUMENTS

| | | |
|---|---|---|
| JP | 2008039811 A | 2/2008 |
| JP | 2015028145 A | 2/2015 |
| JP | 2016074772 A | 5/2016 |

(Continued)

OTHER PUBLICATIONS

Combined Taiwanese Office Action and Search Report issued Aug. 15, 2024, in corresponding Taiwanese Patent Application No. 110104452 (with English translation), 18 pages.
Office Action issued Aug. 27, 2024 in corresponding Japanese Patent Application No. 2022-501729 (with machine English translation), 11 pages.
International Search Report issued Apr. 20, 2021 in PCT/JP2021/002615 (with English translation), 7 pages.
Written Opinion issued Apr. 20, 2021 in PCT/JP2021/002615 (with English translation), 8 pages.
Office Action issued Dec. 17, 2024, in corresponding Japanese Patent Application No. 2022-501729 (with machine English translation), 6 pages.

(Continued)

*Primary Examiner* — John S. Chu
(74) *Attorney, Agent, or Firm* — Element IP, PLC

(57) ABSTRACT

A silicon-containing composition includes a polysiloxane compound and solvent. The polysiloxane compound includes a fluorine atom and a group including an ester bond. The polysiloxane compound preferably includes a first structural unit represented by formula (1), and a second structural unit represented by formula (2). X represents a monovalent organic group having 1 to 20 carbon atoms and comprising a fluorine atom; $R^1$ represents a halogen atom, a hydroxy group, or a monovalent organic group having 1 to 20 carbon atoms; Y represents a monovalent organic group having 1 to 20 carbon atoms and comprising an ester bond; and $R^2$ represents a halogen atom, a hydroxy group, or a monovalent organic group having 1 to 20 carbon atoms.

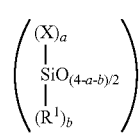

(1)

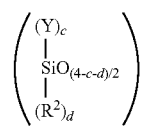

(2)

19 Claims, No Drawings

(56) References Cited

FOREIGN PATENT DOCUMENTS

| | | |
|---|---|---|
| JP | 2016074774 A | 5/2016 |
| KR | 1020170033265 A | 3/2017 |
| KR | 1020170093113 A | 8/2017 |
| TW | 201510123 A | 3/2015 |
| TW | 201615758 A | 5/2016 |
| TW | 201638255 A | 11/2016 |
| WO | WO-2012039337 A1 | 3/2012 |
| WO | WO-2012102261 A1 | 8/2012 |
| WO | WO-2016009939 A1 | 1/2016 |
| WO | WO-2016093172 A1 | 6/2016 |

OTHER PUBLICATIONS

Combined Taiwanese Office Action and Search Report issued Nov. 29, 2024, in corresponding Taiwanese Patent Application No. 110104452 (with English translation), 22 pages.

Office Action issued Nov. 28, 2024, in corresponding Korean Patent Application No. 10-2022-7028164 (with machine English translation), 26 pages.

\* cited by examiner

SILICON-CONTAINING COMPOSITION AND METHOD OF PRODUCING SEMICONDUCTOR SUBSTRATE

CROSS-REFERENCE TO RELATED APPLICATIONS

The present application is a continuation application of International Application No. PCT/JP2021/002615, filed Jan. 26, 2021, which claims priority to Japanese Patent Application No. 2020-026649 filed Feb. 19, 2020. The contents of these applications are incorporated herein by reference in their entirety.

BACKGROUND OF THE INVENTION

Field of the Invention

The present invention relates to a silicon-containing composition and a method of producing a semiconductor substrate.

Discussion of the Background

In pattern formation in production of semiconductor substrates, for example, a multilayer resist process is employed which includes: exposing and developing a resist film laminated via an organic underlayer film, a silicon-containing film, and the like on a substrate; and using as a mask, a resist pattern thus obtained to carry out etching, whereby a substrate is formed having a pattern formed thereon (see PCT International Publication No. 2012/039337).

SUMMARY OF THE INVENTION

According to an aspect of the present invention, a silicon-containing composition includes a polysiloxane compound and solvent. The polysiloxane compound includes a fluorine atom and a group including an ester bond.

According to another aspect of the present invention, a method of producing a semiconductor substrate, includes applying a silicon-containing composition directly or indirectly on a substrate to form a silicon-containing film. A composition for resist film formation is applied directly or indirectly on the silicon-containing film to form a resist film. The resist film is exposed to a radioactive ray. The resist film exposed is developed with an organic solvent. The silicon-containing composition includes a polysiloxane compound and solvent. The polysiloxane compound includes a fluorine atom and a group including an ester bond.

DESCRIPTION OF EMBODIMENTS

As used herein, the words "a" and "an" and the like carry the meaning of "one or more." When an amount, concentration, or other value or parameter is given as a range, and/or its description includes a list of upper and lower values, this is to be understood as specifically disclosing all integers and fractions within the given range, and all ranges formed from any pair of any upper and lower values, regardless of whether subranges are separately disclosed. Where a range of numerical values is recited herein, unless otherwise stated, the range is intended to include the endpoints thereof, as well as all integers and fractions within the range. As an example, a stated range of 1-10 fully describes and includes the independent subrange 3.4-7.2 as does the following list of values: 1, 4, 6, 10.

In the multilayer resist process, to enable forming, on a silicon-containing film, a resist pattern that is superior in terms of rectangularity of a cross-sectional shape, accompanied by no/fewer defects such as residues is demanded.

In a production process of a semiconductor substrate or the like, a silicon-containing film is removed by using a removing liquid. In this procedure, easily removing the silicon-containing film while preventing damage on the substrate is demanded.

According to an embodiment of the invention, a silicon-containing composition is to be used in forming an underlayer film of a resist film to be subjected to development with an organic solvent, and contains: a polysiloxane compound (hereinafter, may be also referred to as "(A) compound" or "compound (A)") including a fluorine atom and a group including an ester bond; and a solvent (hereinafter, may be also referred to as "(B) solvent" or "solvent (B)").

An other embodiment of the invention is a method of producing a semiconductor substrate, the method including: applying a silicon-containing composition directly or indirectly on a substrate; applying a composition for resist film formation directly or indirectly on a silicon-containing film formed by the applying of the silicon-containing composition; applying a composition for resist film formation directly or indirectly on a silicon-containing film formed by the applying of the silicon-containing composition; exposing to a radioactive ray, a resist film formed by the applying of the composition for resist film formation; and developing with an organic solvent, the resist film exposed.

The silicon-containing composition and the method of producing a semiconductor substrate of the embodiments of the present invention enable forming, on a silicon-containing film, a resist pattern that is superior in terms of rectangularity of a cross-sectional shape. In addition, the silicon-containing composition and method of producing a semiconductor substrate of the other embodiment of the present invention enable forming a silicon-containing film that is superior in terms of removability of a silicon-containing film with a removing liquid containing a base (hereinafter, may be also referred to as "film removability"). Therefore, these can be suitably used in production of a semiconductor substrate, and the like.

Hereinafter, the silicon-containing composition and the method of producing a semiconductor substrate of the embodiments of the present invention will be explained in detail.

Silicon-Containing Composition

The silicon-containing composition of one embodiment of the present invention contains the compound (A) and the solvent (B). The composition may contain, within a range not leading to impairment of the effects of the present invention, other optional component(s) (hereinafter, may be merely referred to as "optional component(s)").

Due to containing the compound (A) and the solvent (B), the silicon-containing composition enables forming a resist pattern that is superior in terms of rectangularity of a cross-sectional shape, in forming the resist pattern on a silicon-containing film by development with an organic solvent. Furthermore, the silicon-containing film formed from the silicon-containing composition is superior in terms of removability of a silicon-containing film (film removability) with a removing liquid containing a base. Although not necessarily clarified and without wishing to be bound by any theory, the reason for achieving the aforementioned effects by the composition due to involving such a constitution may be presumed, for example, as in the following. It is considered that due to the compound (A) having a fluorine atom, removing a light-exposed region of a resist film by development with an organic solvent liquid is facilitated when development with an organic solvent is carried out after the forming of the resist film on the silicon-containing film, followed by exposing the resist film, whereby the resist pattern that is superior in terms of rectangularity of a cross-sectional shape can be formed. In addition, it is considered that due to the compound (A) having the group including an ester bond, solubility in the removing liquid containing a base improves, thereby enabling film removability to be improved.

Due to achieving the effects as described above, the silicon-containing composition can be suitably used as a composition for forming a silicon-containing film (i.e., composition for silicon-containing film formation).

In general, a development procedure of a resist film is classified broadly into: development with an organic solvent, in which an organic solvent is used as a developer solution; and development with an alkali, in which an alkaline solution is used as a developer solution, and the silicon-containing composition is suitably used for forming an underlayer film of the resist film to be subjected to the development with an organic solvent. In the case in which the silicon-containing composition is used for forming an underlayer film of a resist film to be subjected to development with an organic solvent, when development with an organic solvent is carried out after the forming and exposing of the resist film, only a light-exposed region of the resist film is dissolved, while the silicon-containing film, being the underlayer film of the resist film, is not dissolved, thereby enabling forming a resist pattern that is superior in terms of rectangularity of a cross-sectional shape.

The resist film to be subjected to development with an organic solvent is preferably a negative tone resist film in particular, and more preferably a negative tone resist film for exposure to an ArF excimer laser beam (for ArF exposure), described later. In other words, the silicon-containing composition may be suitably used in forming an underlayer film of a resist film for ArF exposure, to be subjected to development with an organic solvent.

Each component contained in the silicon-containing composition is described below.

(A) Compound

The compound (A) is a polysiloxane compound including a fluorine atom and a group including an ester bond. As referred to herein, the "ester bond" means a —C(=O)—O— bond or an —O—C(=O)— bond, and the "group including an ester bond" may be exemplified by not only an ester group (—C(=O)—O—R) and an acyloxy group (—O—C(=O)—R), but also groups including a lactone structure, groups including a carbonate bond (—O—C(=O)—O—), and the like. It is to be noted that as referred to herein, the "lactone structure" means a structure having at least one ring (lactone ring) including an ester bond. Furthermore, as referred to herein, the "polysiloxane compound" means a compound including a siloxane bond (—Si—O—Si—).

Due to the compound (A) having the group including an ester bond, forming a silicon-containing film that is superior in terms of film removability is enabled. In addition, due to the compound (A) having a fluorine atom, forming a resist pattern that is superior in terms of rectangularity of a cross-sectional shape is enabled in forming the resist pattern on a silicon-containing film by development with an organic solvent.

The silicon-containing composition may contain one, or two or more types of the compound (A).

In the compound (A), the fluorine atom and the group including an ester bond may be included in one type of a functional group, or these may be each included in different functional groups.

In the compound (A), the group including an ester bond may be bonded directly to a silicon atom, or may be bonded to a silicon atom via another group.

The group including an ester bond is not particularly limited as long as it includes an ester bond, and is exemplified by an ester group, an acyloxy group, a group including a lactone structure, a group including a cyclic carbonate structure, and the like. Of these, in light of further improving the film removability, the ester group is preferred. The compound (A) may have one, or two or more types of the group including an ester bond. As referred to herein, the "cyclic carbonate structure" means a structure including a ring (cyclic carbonate ring) which includes a carbonate bond (—O—C(=O)—O—).

In the compound (A), the fluorine atom may be bonded directly to a silicon atom, or may be bonded to a silicon atom via another group. In light of more effectively achieving the effects of the invention, the fluorine atom is preferably bonded to the silicon atom via another group. In other words, the fluorine atom, in the compound (A), is preferably bonded to the silicon atom as a group including a fluorine atom.

The group including a fluorine atom is exemplified by groups obtained by substituting with a fluorine atom, at least one hydrogen atom included in an organic group, and the like. Of these, in light of enabling forming a resist pattern having more superior rectangularity of a cross-sectional shape, in forming a resist pattern on the silicon-containing film by development with an organic solvent, an aromatic hydrocarbon group having a substituent that includes a fluorine atom is preferred.

The compound (A) is preferably a compound having a first structural unit (hereinafter, may be also referred to as "structural unit (I)") represented by the following formula (1) described later, and a second structural unit (hereinafter, may be also referred to as "structural unit (II)") represented by following formula (2) described later. The compound (A) may have, within a range not leading to impairment of the effects of the present invention, other structural unit(s) (hereinafter, may be merely referred to as "other structural unit") aside from the structural unit (I) and the structural unit (II).

Each structural unit included in the compound (A) is described below.

Structural Unit (I)

The structural unit (I) is a structural unit represented by the following formula (1). The compound (A) may have one, or two or more types of the structural unit (I). When the structural unit (I) includes a monovalent organic group having 1 to 20 carbon atoms (hereinafter, may be also referred to as "fluorine atom-containing group (X)") which includes a fluorine atom represented by X in the following formula (1), a resist pattern having more superior rectangularity of a cross-sectional shape can be formed, in forming a resist pattern on the silicon-containing film by development with an organic solvent.

(1)

In the above formula (1), X represents a monovalent organic group having 1 to 20 carbon atoms and including a fluorine atom; a is an integer of 1 to 3, wherein in a case in which a is no less than 2, a plurality of Xs are identical or different from each other; $R^1$ represents a halogen atom, a hydroxy group, or a monovalent organic group having 1 to 20 carbon atoms; and b is an integer of 0 to 2, wherein in a case in which b is 2, two $R^1$s are identical or different from each other, and wherein a sum of a and b is no greater than 3.

As referred to herein, the "organic group" means a group having at least one carbon atom, and the number of "carbon atoms" means the number of carbon atom(s) constituting a group.

The monovalent organic group having 1 to 20 carbon atoms in the fluorine atom-containing group (X) is exemplified by: a monovalent hydrocarbon group having 1 to 20 carbon atoms; a group (hereinafter, may be also referred to as "group (α)") that contains a divalent heteroatom-containing group between two adjacent carbon atoms of the monovalent hydrocarbon group; a group (hereinafter, may be also referred to as "group (β)") obtained by substituting with a monovalent heteroatom-containing group, a part or all of hydrogen atoms included in the monovalent hydrocarbon group or the group (α); a group (hereinafter, may be also referred to as "group (γ)") obtained by combining the monovalent hydrocarbon group, the group (α), or the group (β) with a divalent heteroatom-containing group; and the like.

As referred to herein, the "hydrocarbon group" may be exemplified by a chain hydrocarbon group, an alicyclic hydrocarbon group, and an aromatic hydrocarbon group. The "hydrocarbon group" may be either a saturated hydrocarbon group or an unsaturated hydrocarbon group. The "chain hydrocarbon group" as referred to herein means a hydrocarbon group not including a ring structure but being constituted with only a chain structure, and may be exemplified by both a linear hydrocarbon group and a branched hydrocarbon group. The "alicyclic hydrocarbon group" as referred to herein means a hydrocarbon group including, as a ring structure, not an aromatic ring structure but an alicyclic structure alone, and may be exemplified by both a monocyclic alicyclic hydrocarbon group and a polycyclic alicyclic hydrocarbon group. With regard to this, it is not necessary for the alicyclic hydrocarbon group to be constituted with only an alicyclic structure; and it may include a chain structure in a part thereof. The "aromatic hydrocarbon group" as referred to herein means a hydrocarbon group including an aromatic ring structure as a ring structure. With regard to this, it is not necessary for the aromatic hydrocarbon group to be constituted with only an aromatic ring structure; it may include a chain structure or an alicyclic structure in a part thereof.

The monovalent hydrocarbon group having 1 to 20 carbon atoms is exemplified by a monovalent chain hydrocarbon group having 1 to 20 carbon atoms, a monovalent alicyclic hydrocarbon group having 3 to 20 carbon atoms, and a monovalent aromatic hydrocarbon group having 6 to 20 carbon atoms.

Examples of the monovalent chain hydrocarbon group having 1 to 20 carbon atoms include: alkyl groups such as a methyl group, an ethyl group, an n-propyl group, an i-propyl group, an n-butyl group, a sec-butyl group, an iso-butyl group, and a tert-butyl group; alkenyl groups such as an ethenyl group, a propenyl group, and a butenyl group; alkynyl groups such as an ethynyl group, a propynyl group, and a butynyl group; and the like.

Examples of the monovalent alicyclic hydrocarbon group having 3 to 20 carbon atoms include: monocyclic alicyclic saturated hydrocarbon groups such as a cyclopentyl group and a cyclohexyl group; polycyclic alicyclic saturated hydrocarbon groups such as a norbornyl group, an adamantyl group, a tricyclodecyl group, and a tetracyclododecyl group; monocyclic alicyclic unsaturated hydrocarbon groups such as a cyclopentenyl group and a cyclohexenyl group; polycyclic alicyclic unsaturated hydrocarbon groups such as a norbornenyl group, a tricyclodecenyl group, and a tetracyclododecenyl group; and the like.

Examples of the monovalent aromatic hydrocarbon group having 6 to 20 carbon atoms include: aryl groups such as a phenyl group, a tolyl group, a xylyl group, a naphthyl group, and an anthryl group; aralkyl groups such as a benzyl group, a phenethyl group, a naphthylmethyl group, and an anthrylmethyl group; and the like.

Exemplary heteroatoms which may constitute the divalent or monovalent heteroatom-containing group include an oxygen atom, a nitrogen atom, a sulfur atom, a phosphorus atom, a silicon atom, a halogen atom, and the like. Examples of the halogen atom include a fluorine atom, a chlorine atom, a bromine atom, an iodine atom, and the like.

Examples of the divalent heteroatom-containing group include —O—, —C(=O)—, —S—, —C(=S)—, —NR'—, groups obtained by combination of at least two of these, and the like. $R^1$ represents a hydrogen atom or a monovalent hydrocarbon group.

Examples of the monovalent heteroatom-containing group include a halogen atom, a hydroxy group, a carboxy group, a cyano group, an amino group, a sulfanyl group, and the like.

The fluorine atom-containing group (X) is exemplified by organic groups having a substituent that contains a fluorine atom. Of these, hydrocarbon groups having a substituent that contains a fluorine atom are preferred, aromatic hydrocarbon groups having a substituent that contains a fluorine atom are more preferred, and aromatic hydrocarbon groups having a fluorine atom as a substituent are still more preferred. The substituent that contains a fluorine atom is exemplified by a fluorine atom, groups obtained by substituting with a fluorine atom, at least one hydrogen atom included in a hydrocarbon group having 1 to 10 carbon atoms, and the like. The aromatic hydrocarbon group having a substituent that contains a fluorine atom is preferably a fluorophenyl group or a pentafluorophenyl group.

a is preferably 1 or 2, and more preferably 1.

The monovalent organic group having 1 to 20 carbon atoms which may be represented by $R^1$ is exemplified by groups similar to the groups exemplified as the monovalent organic group having 1 to 20 carbon atoms in the aforementioned fluorine atom-containing group (X), and the like.

Examples of the halogen atom which may be represented by $R^1$ include a fluorine atom, a chlorine atom, a bromine atom, and an iodine atom.

$R^1$ represents preferably the monovalent chain hydrocarbon group or a monovalent group obtained by substituting with a monovalent heteroatom-containing group, a part or all of hydrogen atoms included in the monovalent aromatic hydrocarbon group or the monovalent hydrocarbon group, more preferably the alkyl group or the aryl group, and still more preferably a methyl group, an ethyl group, or a phenyl group.

b is preferably 0 or 1, and more preferably 0.

Examples of the structural unit (I) include structural units (hereinafter, may be also referred to as "structural units (I-1)

to (I-3)'') derived from compounds represented by the following formulae (1-1) to (1-3), and the like.

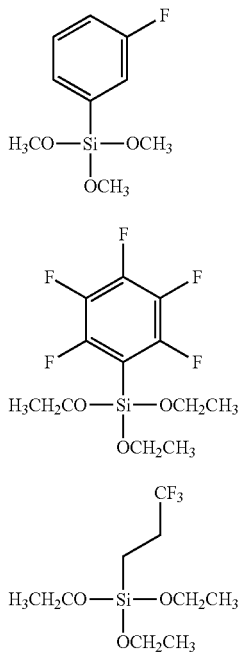

As the structural unit (I), in light of enabling forming a resist pattern having more superior rectangularity of a cross-sectional shape in forming the resist pattern on the silicon-containing film by development with an organic solvent, the structural unit (I-1) or (I-2) is preferred.

The lower limit of a proportion of the structural unit (I) contained in the compound (A) with respect to the total structural units constituting the compound (A) is preferably 1 mol %, more preferably 5 mol %, still more preferably 10 mol %, and particularly preferably 15 mol %. Furthermore, the upper limit of the proportion of the structural unit (I) is preferably 50 mol %, more preferably 40 mol %, still more preferably 35 mol %, and particularly preferably 30 mol %. When the proportion of the structural unit (I) falls within the above range, in forming a resist pattern on the silicon-containing film by development with an organic solvent, the resist pattern can be formed with more superior rectangularity of a cross-sectional shape.

Structural Unit (II)

The structural unit (II) is a structural unit represented by the following formula (2). The compound (A) may have one, or two or more types of the structural unit (II). The structural unit (II) enables forming a silicon-containing film that is more superior in the film removability, due to having a monovalent organic group (hereinafter, may be also referred to as "ester bond-containing group (Y)") having 1 to 20 carbon atoms and including an ester bond represented by Y in the following formula (2).

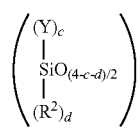
(2)

In the above formula (2), Y represents a monovalent organic group having 1 to 20 carbon atoms and including an ester bond; c is an integer of 1 to 3, wherein in a case in which c is no less than 2, a plurality of Ys are identical or different from each other; $R^2$ represents a halogen atom, a hydroxy group, or a monovalent organic group having 1 to 20 carbon atoms; and d is an integer of 0 to 2, wherein in a case in which d is 2, two $R^2$s are identical or different from each other, and wherein a sum of c and d is no greater than 3.

The monovalent organic group having 1 to 20 carbon atoms in the ester bond-containing group (Y) is exemplified by groups similar to the groups exemplified as the monovalent organic group having 1 to 20 carbon atoms in the fluorine atom-containing group (X) in the above formula (1), and the like.

The ester bond-containing group (Y) is exemplified by a group including an ester group, a group including an acyloxy group, a group including a lactone structure, a group including a cyclic carbonate structure, and the like.

The group including an ester group is exemplified by a group (hereinafter, may be also referred to as "ester bond-containing group (Y-1)") represented by the following formula (3-1), and the like.

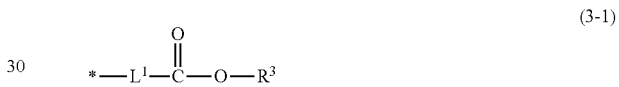

In the above formula (3-1), $L^1$ represents a single bond or a divalent linking group; $R^3$ represents a monovalent hydrocarbon group having 1 to 10 carbon atoms; and * denotes a site bonding to the silicon atom in the above formula (2).

The divalent linking group which may be represented by $L^1$ is exemplified by a divalent organic group having 1 to 10 carbon atoms, and the like. Exemplary divalent organic groups having 1 to 10 carbon atoms include groups obtained by removing one hydrogen atom from the monovalent organic group having 1 to 10 carbon atoms, among the groups exemplified as the monovalent organic group having 1 to 20 carbon atoms in the fluorine atom-containing group (X) in the above formula (1), and the like.

$L^1$ represents preferably a single bond, the divalent hydrocarbon group having 1 to 10 carbon atoms, or a group including a divalent heteroatom-containing group between adjacent carbon atoms of the divalent hydrocarbon group having 1 to 10 carbon atoms, and more preferably a single bond, an alkylene group, or a group including —S— between adjacent carbon atoms of an alkenylene group or an alkylene group.

Examples of the monovalent hydrocarbon group having 1 to 10 carbon atoms represented by $R^3$ include the monovalent hydrocarbon groups having 1 to 10 carbon atoms, among the groups exemplified as the monovalent hydrocarbon group having 1 to 20 carbon atoms in the fluorine atom-containing group (X) in the above formula (1), and the like.

$R^3$ represents preferably the monovalent chain hydrocarbon group or the monovalent alicyclic hydrocarbon group. Furthermore, $R^3$ represents preferably a group that is capable of bonding to an ethereal oxygen atom of a carbonyloxy group at the tertiary carbon atom. Examples of such a group include a tert-butyl group, a 1-methylcyclopentan-1-yl group, and the like.

The group including an acyloxy group is exemplified by a group (hereinafter, may be also referred to as "ester bond-containing group (Y-2)") represented by the following formula (3-2), and the like.

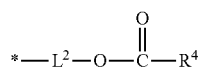
(3-2)

In the above formula (3-2), $L^2$ represents a single bond or a divalent linking group; $R^4$ represents a monovalent hydrocarbon group having 1 to 10 carbon atoms; and * denotes a site bonding to the silicon atom in the above formula (2).

The divalent linking group which may be represented by $L^2$ is exemplified by groups similar to the groups exemplified as $L^1$ in the above formula (3-1), and the like. $L^2$ represents preferably a single bond, a methylene group, or a divalent alkylene group having 2 to 10 carbon atoms, and more preferably a methylene group.

The monovalent hydrocarbon group having 1 to 10 carbon atoms represented by $R^4$ is exemplified by groups similar to the groups exemplified as $R^3$ in the above formula (3-1), and the like. $R^4$ represents preferably the monovalent chain hydrocarbon group.

The group including a lactone structure is exemplified by a group (hereinafter, may be also referred to as "ester bond-containing group (Y-3)") represented by the following formula (3-3), and the like.

*-L³-R⁵ (3-3)

In the above formula (3-3), $L^3$ represents a single bond or a divalent linking group; $R^5$ represents a monovalent group having a lactone structure; and * denotes a site bonding to the silicon atom in the above formula (2).

The divalent linking group which may be represented by $L^3$ is exemplified by groups similar to the groups exemplified as $L^1$ in the above formula (3-1), and the like. $L^3$ represents preferably a single bond.

Examples of the lactone structure in $R^5$ include: monocyclic lactone structures such as a propiolactone structure, a butyrolactone structure, a valerolactone structure, and a caprolactone structure; polycyclic lactone structures such as a cyclopentanelactone structure, a cyclohexanelactone structure, a norbornanelactone structure, a benzobutyrolactone structure, and a benzovalerolactone structure; and the like. Of these, the monocyclic lactone structures are preferred, and a butyrolactone structure is more preferred.

The group including a cyclic carbonate structure is exemplified by a group (hereinafter, may be also referred to as "ester bond-containing group (Y-4)") represented by the following formula (3-4), and the like.

*-L⁴-R⁶ (3-4)

In the above formula (3-4), $L^4$ represents a single bond or a divalent linking group; $R^6$ represents a monovalent group having a cyclic carbonate structure; and * denotes a site bonding to the silicon atom in the above formula (2).

The divalent linking group which may be represented by $L^4$ is exemplified by groups similar to the groups exemplified as $L^1$ in the above formula (3-1), and the like. $L^4$ represents preferably the divalent alkylene group having 2 to 10 carbon atoms.

Examples of the cyclic carbonate structure in $R^6$ include: monocyclic cyclic carbonate structures such as an ethylene carbonate structure, a trimethylene carbonate structure, and a tetramethylene carbonate structure; polycyclic carbonate structures such as a cyclopentylene carbonate structure, a cyclohexylene carbonate structure, a norbomylene carbonate structure, a phenylene carbonate structure, and a naphthylene carbonate structure; and the like. Of these, the monocyclic cyclic carbonate structures are preferred, and the ethylene carbonate structure is more preferred.

The ester bond-containing group (Y) is, in light of further improving the film removability, preferably the ester bond-containing group (Y-1).

c is preferably 1 or 2, and more preferably 1.

The monovalent organic group having 1 to 20 carbon atoms which may be represented by $R^2$ is exemplified by groups similar to the groups exemplified as the monovalent organic group having 1 to 20 carbon atoms in the fluorine atom-containing group (X) in the above formula (1), and the like.

Examples of the halogen atom which may be represented by $R^2$ include a fluorine atom, a chlorine atom, a bromine atom, and an iodine atom.

$R^2$ represents preferably the monovalent chain hydrocarbon group, the monovalent aromatic hydrocarbon group, or the monovalent group obtained by substituting with the monovalent heteroatom-containing group, a part or all of hydrogen atoms included in the monovalent hydrocarbon group, more preferably the alkyl group or the aryl group, and still more preferably a methyl group, an ethyl group, or a phenyl group.

d is preferably 0 or 1, and more preferably 0.

Examples of the structural unit (II) include structural units (hereinafter, may be also referred to as "structural units (II-1) to (II-8)") derived from compounds represented by the following formulae (2-1) to (2-8), and the like.

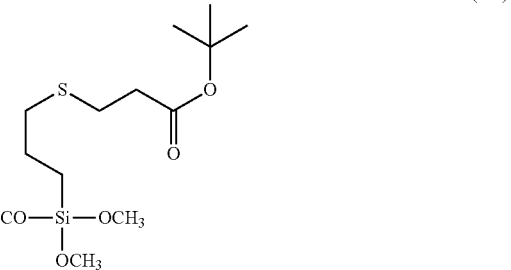
(2-1)

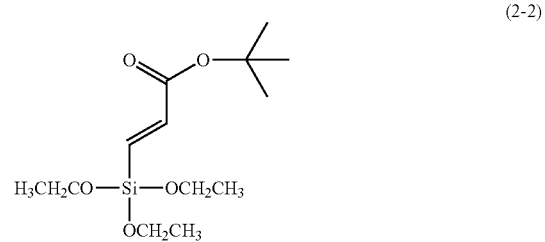
(2-2)

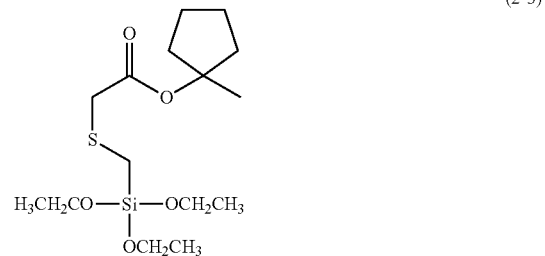
(2-3)

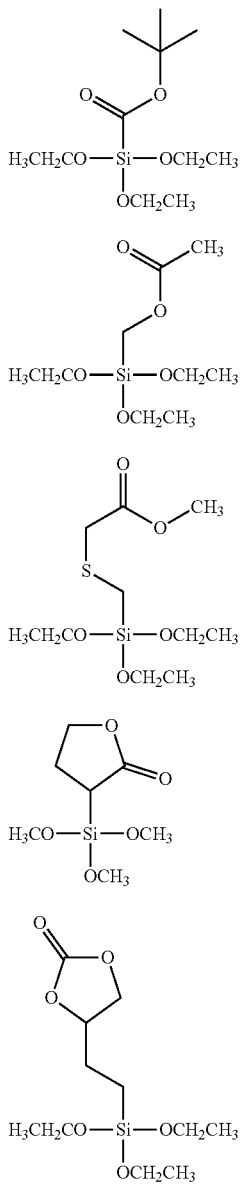

The structural unit (II) is, in light of further improving the film removability, preferably one of the structural units (II-1) to (II-4) and (II-6), and more preferably one of the structural units (II-1) to (II-4).

The lower limit of a proportion of the structural unit (II) contained in the compound (A) with respect to the total structural units constituting the compound (A) is preferably 0.5 mol %, more preferably 1 mol %, and still more preferably 2 mol %. Furthermore, the upper limit of the proportion of the structural unit (II) is preferably 30 mol %, more preferably 25 mol %, and still more preferably 20 mol %. When the proportion of the structural unit (II) falls within the above range, the silicon-containing film can be formed being more superior in the film removability.

Other Structural Unit

Examples of the Other Structural Unit Include a Structural Unit (Hereinafter, May be also referred to as "structural unit (III)") represented by the following formula (4), a structural unit (hereinafter, may be also referred to as "structural unit (IV)") represented by the following formula (5) described later, and the like. In the case in which the compound (A) has the structural unit (III), storage stability and coating characteristics of the silicon-containing composition can be improved. In the case in which the compound (A) has the structural unit (IV), resistance to etching with oxygen gas of the silicon-containing film formed from the silicon-containing composition can be improved.

$$\left( \begin{array}{c} (R^7)_e \\ | \\ SiO_{(4-e)/2} \end{array} \right) \quad (4)$$

In the above formula (4), $R^7$ represents a halogen atom, a hydroxy group, or a monovalent organic group having 1 to 20 carbon atoms; and e is an integer of 1 to 3, wherein in a case in which e is no less than 2, a plurality of $R^7$s are identical or different from each other.

The monovalent organic group having 1 to 20 carbon atoms which may be represented by $R^7$ is exemplified by groups similar to the groups exemplified as the monovalent organic group having 1 to 20 carbon atoms in the fluorine atom-containing group (X) in the above formula (1), and the like.

Examples of the halogen atom which may be represented by $R^7$ include a fluorine atom, a chlorine atom, a bromine atom, and an iodine atom.

$R^7$ represents preferably the monovalent aromatic hydrocarbon group, more preferably the aryl group, and still more preferably a phenyl group.

e is preferably 1.

In the case in which the compound (A) has the structural unit (III) as the other structural unit, the lower limit of a proportion of the structural unit (III) with respect to the total structural units constituting the compound (A) is preferably 1 mol %, more preferably 5 mol %, and still more preferably 10 mol %. The upper limit of the proportion is preferably 40 mol %, more preferably 30 mol %, and still more preferably 25 mol %.

$$(SiO_{4/2}) \quad (5)$$

In the case in which the compound (A) has the structural unit (IV) as the other structural unit, the lower limit of a proportion of the structural unit (IV) with respect to the total structural units constituting the compound (A) is preferably 30 mol %, more preferably 40 mol %, and still more preferably 50 mol %. The upper limit of the proportion is preferably 95 mol %, more preferably 90 mol %, and still more preferably 85 mol %.

The lower limit of a proportion of the compound (A) contained in the silicon-containing composition with respect to total components contained in the silicon-containing composition is preferably 0.1% by mass, more preferably 0.5% by mass, and still more preferably 1% by mass. The upper limit of the proportion is preferably 10% by mass, more preferably 7.5% by mass, and still more preferably 5% by mass.

The compound (A) preferably has a form of a polymer. A "polymer" as referred to herein means a compound having no less than two structural units; in a case in which an identical structural unit repeats twice or more, this structural unit may be also referred to as a "repeating unit." In the case in which the compound (A) has the form of a polymer, the lower limit of a polystyrene equivalent weight average molecular weight (Mw) of the compound (A) as determined by gel permeation chromatography is preferably 1,000, more preferably 1,200, still more preferably 1,500, and particularly preferably 1,600. The upper limit of the Mw is preferably 10,000, more preferably 5,000, still more preferably 3,000, and particularly preferably 2,500.

It is to be noted that as referred to herein, the Mw of the compound (A) is a value measured by gel permeation chromatography (GPC) using GPC columns available from Tosoh Corporation ("G2000 HXL"×2, "G3000 HXL"×1, and "G4000 HXL"×1) under the following conditions.

elution solvent: tetrahydrofuran
flow rate: 1.0 mL/min
sample concentration: 1.0% by mass
amount of injected sample: 100 uL
column temperature: 40° C.
detector: differential refractometer
standard substance: mono-dispersed polystyrene The compound (A) can be synthesized by using a monomer that gives each structural unit according to a common procedure. For example, the compound (A) can be obtained by: carrying out hydrolytic condensation with a monomer that gives the structural unit (I) and a monomer that gives the structural unit (II), as well as, as necessary, monomer(s) that give(s) the other structural unit(s), in a solvent in the presence of water and a catalyst such as oxalic acid; and preferably subjecting a solution including a thus generated hydrolytic condensation product to purification by solvent substitution or the like in the presence of a dehydrating agent such as orthoformic acid trimethyl ester. It is believed that by the hydrolytic condensation reaction or the like, respective monomers are incorporated into the compound (A) regardless of a type thereof, and proportions of the structural units (I) and (II) and the other structural unit(s) in the thus synthesized compound (A) will typically be equivalent to proportions of the charge amounts of respective monomers used in the synthesis reaction.

(B) Solvent

The solvent (B) is not particularly limited and is exemplified by an alcohol solvent, a ketone solvent, an ether solvent, an ester solvent, a nitrogen-containing solvent, water, and the like. The silicon-containing composition may contain one, or two or more types of the solvent (B).

Examples of the alcohol solvent include: monohydric alcohol solvents such as methanol, ethanol, n-propanol, iso-propanol, n-butanol, and iso-butanol; polyhydric alcohol solvents such as ethylene glycol, 1,2-propylene glycol, diethylene glycol, and dipropylene glycol; and the like.

Examples of the ketone solvent include acetone, methyl ethyl ketone, methyl n-propyl ketone, methyl iso-butyl ketone, cyclohexanone, and the like.

Examples of the ether solvent include ethyl ether, isopropyl ether, ethylene glycol dibutyl ether, diethylene glycol monomethyl ether, diethylene glycol monoethyl ether, diethylene glycol diethyl ether, propylene glycol monomethyl ether, propylene glycol monoethyl ether, propylene glycol monopropyl ether, tetrahydrofuran, and the like.

Examples of the ester solvent include ethyl acetate, γ-butyrolactone, n-butyl acetate, ethylene glycol monomethyl ether acetate, ethylene glycol monoethyl ether acetate, diethylene glycol monomethyl ether acetate, diethylene glycol monoethyl ether acetate, propylene glycol monomethyl ether acetate, propylene glycol monoethyl ether acetate, dipropylene glycol monomethyl ether acetate, dipropylene glycol monoethyl ether acetate, ethyl propionate, n-butyl propionate, methyl lactate, ethyl lactate, and the like.

Examples of the nitrogen-containing solvent include N,N-dimethylformamide, N,N-dimethylacetamide, N-methylpyrrolidone, and the like.

Of these, the ether solvent or the ester solvent is preferred, and due to superiority in film formability, the ether solvent having a glycol structure or the ester solvent having a glycol structure is more preferred.

Examples of the ether solvent having a glycol structure and the ester solvent having a glycol structure include propylene glycol monomethyl ether, propylene glycol monoethyl ether, propylene glycol monopropyl ether, propylene glycol monomethyl ether acetate, propylene glycol monoethyl ether acetate, propylene glycol monopropyl ether acetate, and the like. Of these, propylene glycol monomethyl ether acetate and propylene glycol monoethyl ether are preferred, and propylene glycol monomethyl ether is more preferred.

The lower limit of a proportion of the solvent (B) contained in the silicon-containing composition with respect to total components contained in the silicon-containing composition is preferably 90% by mass, more preferably 92.5% by mass, and still more preferably 95% by mass. The upper limit of the proportion is preferably 99.9% by mass, more preferably 99.5% by mass, and still more preferably 99% by mass.

Optional Component(s)

The optional component(s) is/are exemplified by an acid generating agent, a basic compound (including a base generating agent), a radical generating agent, a surfactant, colloidal silica, colloidal alumina, an organic polymer, and the like. The silicon-containing composition may contain one, or two or more types of the optional component.

In the case in which the silicon-containing composition contains the optional component(s), the proportion of the optional component(s) contained in the silicon-containing composition may be appropriately determined in accordance with the type of the optional component(s) used, and to fall within a range not leading to impairment of the effects of the present invention.

Preparation Procedure of Silicon-Containing Composition

A procedure of preparing the silicon-containing composition is not particularly limited, and the silicon-containing composition may be prepared according to a common procedure. The silicon-containing composition may be prepared by, for example: mixing at a predetermined ratio, a solution of the compound (A), the solvent (B), and as needed, the optional component(s); and preferably filtering a resulting mixture through a filter, etc. having a pore size of no greater than 0.2 μm.

Method of Producing Semiconductor Substrate

The method of producing a semiconductor substrate of the other embodiment of the present invention includes: a step (hereinafter, may be also referred to as "applying step of a silicon-containing composition") of applying a silicon-containing composition directly or indirectly on a substrate; a step (hereinafter, may be also referred to as "applying step of a composition for resist film formation") of applying a composition for resist film formation directly or indirectly on a silicon-containing film formed by the applying of a silicon-containing composition; a step (hereinafter, may be also referred to as "exposing step") of exposing to a radioactive ray, a resist film formed by the applying step of a composition for resist film formation; and a step (hereinafter, may be also referred to as "development step with an organic solvent") of developing with an organic solvent, the resist film exposed. In the applying step of a silicon-containing composition of the method of producing a semiconductor substrate, the silicon-containing composition is used as the silicon-containing composition.

The method of producing a semiconductor substrate may further include, as needed, a step (hereinafter, may be also referred to as "forming step of an organic underlayer film") of forming an organic underlayer film directly or indirectly on the substrate, before the applying step of a silicon-containing composition.

In addition, the method of producing a semiconductor substrate may further include, as needed, a step (hereinafter, may be also referred to as "removing step") of removing the silicon-containing film with a removing liquid containing a base, after the applying step of a silicon-containing composition.

According to the method of producing a semiconductor substrate, due to the silicon-containing composition of the aforementioned one embodiment being used as the silicon-containing composition in the applying step of a silicon-containing composition, forming a resist pattern that is superior in terms of rectangularity of a cross-sectional shape on the silicon-containing film is enabled. In addition, the silicon-containing film formed by the applying step of a silicon-containing composition can be removed with a removing liquid containing a base, due to the silicon-containing being superior in film removability.

Hereinafter, each step included in the method of producing a semiconductor substrate will be described.

Applying Step of Silicon-Containing Composition

In this step, the silicon-containing composition is applied directly or indirectly on a substrate. By this step, a coating film of the silicon-containing composition is formed directly or indirectly on the substrate and the silicon-containing film is formed by, e.g., subjecting the coating film to, typically, heating, thereby allowing for hardening.

In this step, the silicon-containing composition described above is used as the silicon-containing composition.

The substrate is exemplified by insulating films of silicon oxide, silicon nitride, a silicon oxynitride, a polysiloxane, or the like; resin substrates; and the like. Furthermore, as the substrate, a substrate having a pattern formed thereon with wiring grooves (trenches), plug grooves (vias), or the like may be used.

A procedure for applying the composition for silicon-containing film formation is not particularly limited, and for example, spin-coating or the like may be exemplified.

The case of applying the composition for silicon-containing film formation indirectly on the substrate may be exemplified by a case in which the silicon-containing composition is applied on an other film formed on the substrate, and the like. The other film formed on the substrate is exemplified by an organic underlayer film, an antireflective film, or a low-dielectric insulating film formed by the forming step of an organic underlayer film, to be described later, and the like.

In the case in which the coating film is subjected to heating, the atmosphere thereof is not particularly limited, and may be, for example, an ambient air, a nitrogen atmosphere, or the like. In general, the coating film is subjected to heating in the ambient air. Various conditions such as a heating temperature and a heating time period in subjecting the coating film to heating may be predetermined appropriately. The lower limit of the heating temperature is preferably 90° C., more preferably 150° C., and still more preferably 200° C. The upper limit of the heating temperature is preferably 550° C., more preferably 450° C., and still more preferably 300° C. The lower limit of the heating time period is preferably 15 sec, and more preferably 30 sec. The upper limit of the heating time period is preferably 1,200 sec, and more preferably 600 sec.

In a case in which the composition for silicon-containing film formation contains the acid generating agent and the acid generating agent is a radiation-sensitive acid generating agent, formation of the silicon-containing film may be further promoted through a combination of an exposure and heating. Examples of the radioactive ray which can be used for the exposure include radioactive rays similar to those exemplified in connection with the exposing step described later.

The lower limit of an average thickness of the silicon-containing film to be formed by this step is preferably 1 nm, more preferably 3 nm, and still more preferably 5 nm. The upper limit of the average thickness is preferably 500 nm, more preferably 300 nm, and still more preferably 200 nm. It is to be noted that the average thickness of the silicon-containing film is a value measured by using a spectroscopic ellipsometer ("M2000D," available from J.A. Woollam Co.).

Applying Step of Composition for Resist Film Formation

In this step, a composition for resist film formation is applied directly or indirectly on the silicon-containing film formed by the applying step of a silicon-containing composition. By this step, the resist film is directly or indirectly formed on the silicon-containing film.

A procedure for applying the composition for resist film formation is not particularly limited, and for example, spin-coating or the like may be exemplified.

In more detail with regard to this step, for example, the resist film is formed by: applying the resist composition such that a resultant resist film has a predetermined thickness; and thereafter subjecting the resist composition to prebaking (hereinafter, may be also referred to as "PB") to evaporate the solvent in the coating film.

A PB temperature and a PB time period of may be appropriately predetermined in accordance with the type and the like the composition for resist film formation employed. The lower limit of the PB temperature is preferably 30° C., and more preferably 50° C. The upper limit of the PB temperature is preferably 200° C., and more preferably 150° C. The lower limit of the PB time period is preferably 10 sec, and more preferably 30 sec. The upper limit of the PB time period is preferably 600 sec, and more preferably 300 sec.

In general, development procedures of a resist film are classified broadly into development with an organic solvent in which an organic solvent is used as a developer solution, and development with an alkali in which an alkaline solution is used as a developer solution. The composition for resist film formation used in this applying step is limited to a composition for resist film formation that enables forming a resist film to be subjected to development with an organic solvent. The reason for this limitation is that in the case in which a composition for resist film formation that enables forming a resist film to be subjected to development with an alkali, not only a light-exposed region of the resist film but also the silicon-containing film situated on or above the underlayer of the resist film formed by the applying step of a silicon-containing composition is dissolved in the alkaline developer solution, in a development step with an alkali.

The composition for resist film formation used in this step is not particularly limited as long as it enables forming a resist film to be subjected to development with an organic solvent, and a well-known composition for resist film formation can be used. For example, a composition for negative tone resist film formation containing a radiation-sensitive acid generating agent, or the like may be employed. In particular, a composition for negative tone resist film formation, for use in exposure to an ArF excimer laser beam (for ArF exposure), described later, is preferred.

Exposing Step

In this step, the resist film formed by the applying step of a composition for resist film formation is exposed to a radioactive ray. By this step, a difference in solubility in an organic solvent as a developer solution is created between the light-exposed regions and light-unexposed regions of the resist film. In more detail, the solubility in an organic solvent of the light-exposed regions of the resist film is decreased.

The radioactive ray used in the exposure may be appropriately selected in accordance with the type, etc., of the composition for resist film formation used. Examples of the radioactive ray include: electromagnetic waves such as visible light rays, ultraviolet rays, far ultraviolet rays, X-rays, and γ-rays; and particle rays such as electron beams, molecular beams, and ion beams. Among these, far ultraviolet rays are preferred, a KrF excimer laser beam (wavelength: 248 nm), an ArF excimer laser beam (wavelength: 193 nm), an $F_2$ excimer laser beam (wavelength: 157 nm), a $Kr_2$ excimer laser beam (wavelength: 147 nm), an ArKr excimer laser beam (wavelength: 134 nm), or an extreme ultraviolet ray (wavelength: 13.5 nm, etc.; may be also referred to as "EUV") is more preferred, and an ArF excimer laser beam is still more preferred. Furthermore, the exposure conditions may be appropriately predetermined in accordance with the type, etc., of the composition for resist film formation used.

Additionally, in this step, post exposure baking (hereinafter, may be also referred to as "PEB") may be carried out after the exposure for the purpose of improving types of performance of the resist film such as a resolution, a pattern profile, and developability. A PEB temperature and a PEB time period may be appropriately predetermined in accordance with the type and the like of the composition for resist film formation employed. The lower limit of the PEB temperature is preferably 50° C., and more preferably 70° C. The upper limit of the PEB temperature is preferably 200° C., and more preferably 150° C. The lower limit of the PEB time period is preferably 10 sec, and more preferably 30 sec. The upper limit of the PEB time period is preferably 600 sec, and more preferably 300 sec.

Development Step with Organic Solvent

In this step, the resist film exposed is developed with an organic solvent. Since the difference in solubility in an organic solvent as a developer solution is created between the light-exposed regions and light-unexposed regions of the resist film by the exposing step, carrying out the development with an organic solvent enables forming a resist pattern by removing portions having relatively higher solubility in the organic solvent. In more detail, due to the exposing step leading to a decrease in solubility in the organic solvent of the light-exposed regions of the resist film, the resist pattern is formed by removing regions unexposed with light, which have relatively higher solubility in the organic solvent, through carrying out the development with the organic solvent.

The developer solution used in the development with an organic solvent is not particularly limited as long as the developer solution is for use in development with an organic solvent, and any well-known developer solution may be used. For example, a developer solution similar to those exemplified as the solvent (B) in the silicon-containing composition, described above, or the like may be employed.

In this step, after the development with an organic solvent, washing and/or drying may be carried out.

Forming Step of Organic Underlayer Film

In this step, before the applying step of a silicon-containing composition, an organic underlayer film is formed directly or indirectly on the substrate. This step is an arbitrary step. By this step, the organic underlayer film is formed directly or indirectly on the substrate. It is to be noted that the expression "before the applying step of a silicon-containing composition" as referred to herein means not only immediately before the applying step of a silicon-containing composition, but means any time point upstream of the applying step of a silicon-containing composition. Therefore, other arbitrary step(s) may be included between this forming step and the applying step of a silicon-containing composition.

The organic underlayer film can be formed by applying a composition for organic underlayer film formation, or the like. A procedure of forming the organic underlayer film by applying the composition for organic underlayer film formation is exemplified by a procedure of applying the composition for silicon-containing film formation directly or indirectly on the substrate to form a coating film; and hardening the coating film by subjecting the coating film to an exposure and/or heating. Examples of the composition for organic underlayer film formation include "HM8006," available from JSR Corporation, and the like. Conditions for the heating and/or the exposure may be appropriately predetermined in accordance with the type, etc., of the composition for organic underlayer film formation used.

The case of forming the organic underlayer film indirectly on the substrate may be exemplified by a case of forming the organic underlayer film on a low-dielectric insulating film formed on the substrate, and the like.

Removing Step

In this step, after the applying step of a silicon-containing composition, the silicon-containing film is removed with a removing liquid containing a base (hereinafter, may be also referred to as "base-containing removing liquid"). This step is an arbitrary step. By this step, the silicon-containing film is removed from the substrate. It is to be noted that the expression "after the applying step of a silicon-containing composition" as referred to means not only immediately after the applying step of a silicon-containing composition, but means any time point downstream of the applying step of the silicon-containing composition. Therefore, the expression "after the applying step of a silicon-containing composition" may involve being after the applying step of a silicon-containing composition, and not only before the applying step of a composition for resist film formation, but also, for example, after the development step with an organic solvent.

In the case in which this removing step is carried out after the applying step of a silicon-containing composition and before the applying step of a composition for resist film formation, for example, the silicon-containing film can be easily removed as a rework step when defects and/or the like are detected on the silicon-containing film before the applying step of a composition for resist film formation.

In addition, residues of the silicon-containing film after the etching can be removed.

The base-containing removing liquid is not particularly limited, as long as it is a basic solution containing a base. Examples of the base include sodium hydroxide, potassium hydroxide, sodium carbonate, sodium silicate, sodium metasilicate, ammonia, ethylamine, n-propylamine, diethylamine, di-n-propylamine, triethylamine, methyldiethylamine, dimethylethanolamine, triethanolamine, tetramethylammonium hydroxide (hereinafter, may be also referred to as "TMAH"), tetraethylammonium hydroxide, pyrrole, piperidine, choline, 1,8-diazabicyclo[5.4.0]-7-undecene, 1,5-diazabicyclo[4.3.0]-5-nonene, and the like. Of these, in light of avoiding damage on the substrate, ammonia is preferred.

As the base-containing removing liquid, in light of further improving removability of the silicon-containing film, a liquid containing the base and water, or a liquid containing a base, hydrogen peroxide, and water is preferred.

A procedure of removing the silicon-containing film is not particularly limited as long as the procedure enables bringing the silicon-containing film to be in contact with the base-containing removing liquid, and the procedure is exemplified by: immersing the substrate in the base-containing removing liquid; spraying the base-containing removing liquid; applying the base-containing removing liquid; and the like.

When the silicon-containing film is removed, various conditions such as a temperature and a time period are not particularly limited, and may be appropriately predetermined in accordance with a film thickness of the silicon-containing film, the type of the base-containing removing liquid used, and the like. The lower limit of the temperature is preferably 20° C., more preferably 40° C., and still more preferably 50° C. The upper limit of the temperature is preferably 300° C., and more preferably 100° C. The lower limit of the time period is preferably 5 sec, and more preferably 30 sec. The upper limit of the time period is preferably 10 min, and more preferably 180 sec.

In this step, after the silicon-containing film is removed, washing and/or drying may be carried out.

EXAMPLES

Hereinafter, Examples are described. It is to be noted that the following Examples merely illustrate typical Examples of the embodiments of the present invention, and the Examples should not be construed to narrow the scope of the present invention.

In the present Examples, measurement of a weight average molecular weight (Mw) of the compound (A), measurement of a concentration of the compound (A) in each solution, and measurement of an average thickness of each film were carried out by the following methods, respectively.

Measurement of Weight Average Molecular Weight (Mw)

Measurement of the weight average molecular weight (Mw) of the compound (A) was carried out by gel permeation chromatography (GPC) by using GPC columns ("G2000 HXL"×2, "G3000 HXL"×1, and "G4000 HXL"×1, all available from Tosoh Corporation) under the following conditions.

elution solvent: tetrahydrofuran
flow rate: 1.0 mL/min
sample concentration: 1.0% by mass
amount of injected sample: 100 uL
column temperature: 40° C.
detector: differential refractometer
standard substance: mono-dispersed polystyrene Concentration of Compound (A) in Solution The concentration (unit: % by mass) of the compound (A) in the solution was determined by: baking 0.5 g of the solution of the compound (A) at 250° C. for 30 min; measuring a mass of a residue thus obtained; and dividing the mass of the residue by the mass of the solution of the compound (A).

Average Thickness of Film The average thickness of the film was measured by using a spectroscopic ellipsometer ("M2000D," available from J.A. Woollam Co.).

Synthesis of Compound (A)

Monomers (hereinafter, may be also referred to as "monomers (M-1) to (M-13)") used for synthesis in Examples 1-1 to 1-21 and Comparative Examples 1-1 and 1-2 are presented below. Furthermore, in the following Examples 1-1 to 1-21 and Comparative Examples 1-1 and 1-2, the term "mol %" means a value, provided that the total mol number of the monomers (M-1) to (M-13) used was 100 mol %.

(M-1)

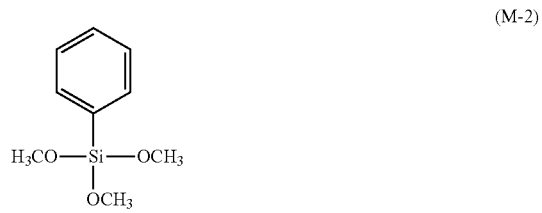
(M-2)

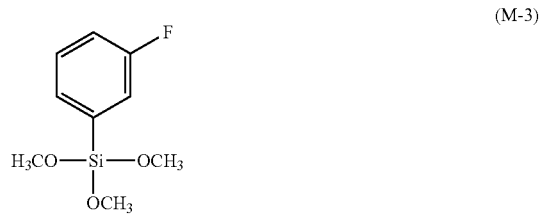
(M-3)

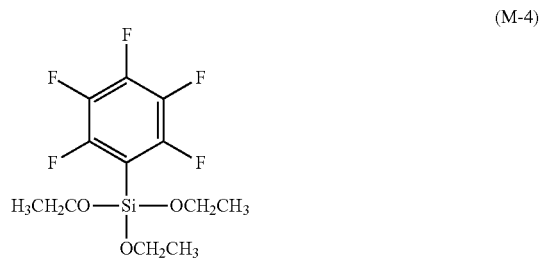
(M-4)

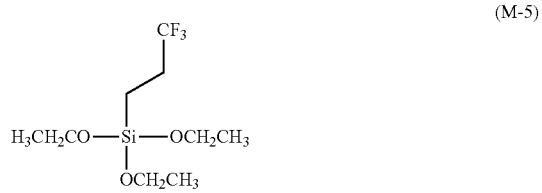
(M-5)

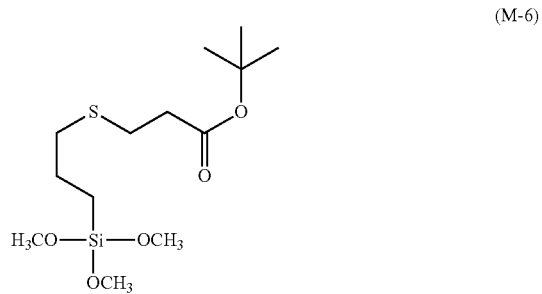
(M-6)

(M-7)

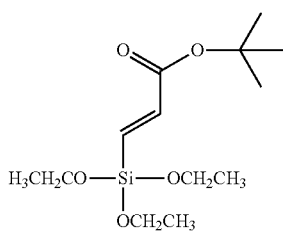

(M-8)

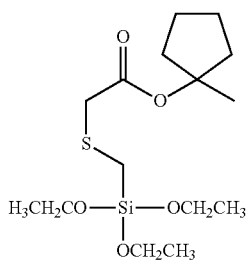

(M-9)

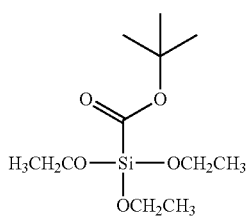

(M-10)

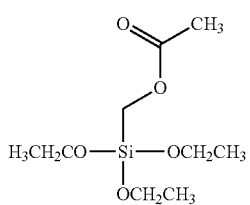

(M-11)

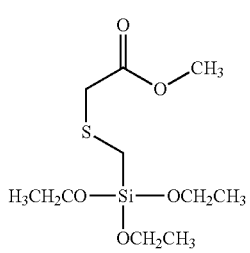

(M-12)

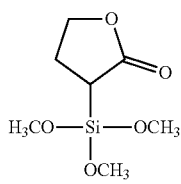

(M-13)

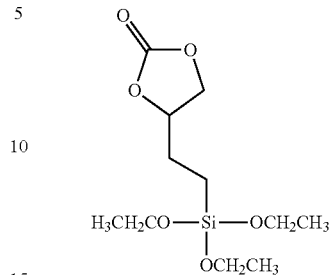

Example 1-1: Synthesis of Compound (A-1)

In a reaction vessel, a monomer solution was prepared by dissolving in 62 parts by mass of propylene glycol monoethyl ether, the compound (M-1), the compound (M-3), and the compound (M-6) such that the molar ratio became 84/15/1 (by mol %). The internal temperature of the reaction vessel was adjusted to 60° C., and 40 parts by mass of a 9.1% by mass aqueous oxalic acid solution were added dropwise over 20 min with stirring. A time point of starting the dropwise addition was defined as a start time of the reaction, and the reaction was performed for 4 hrs. After completion of the reaction, the internal temperature of the reaction vessel was lowered to no greater than 30° C. To a thus cooled reaction solution, 550 parts by mass of propylene glycol monoethyl ether were added. Thereafter, water, alcohols generated by the reaction, and excess propylene glycol monoethyl ether were removed by using an evaporator to give a propylene glycol monoethyl ether solution of the compound (A-1). The Mw of the compound (A-1) was 1,700. The concentration of the compound (A-1) in the propylene glycol monoethyl ether solution was 7.2% by mass.

Examples 1-2 to 1-21, and Comparative Examples 1-1 and 1-2: Synthesis of Compounds (A-2) to (A-21), (AJ-1), and (AJ-2)

Propylene glycol monoethyl ether solutions of compounds (A-2) to (A-21), (AJ-1), and (AJ-2) were obtained by a similar operation to that of Example 1-1 except that each monomer of the type and in the amount shown in Table 1 below were used. It is to be noted that in Table 1 below, "-" indicates that the corresponding monomer was not used. With regard to the compounds (A) obtained, concentrations (% by mass) thereof in the solutions, and the Mw thereof are shown together in Table 1.

TABLE 1

| | (A) Compound | Amount of each monomer charged (mol %) | | | | | | | | | | | | | Concentration of compound (A) in solution |
|---|---|---|---|---|---|---|---|---|---|---|---|---|---|---|---|
| | | M-1 | M-2 | M-3 | M-4 | M-5 | M-6 | M-7 | M-8 | M-9 | M-10 | M-11 | M-12 | M-13 | Mw | (% by mass) |
| Example 1-1 | A-1 | 84 | — | 15 | — | — | 1 | — | — | — | — | — | — | — | 1,700 | 7.2 |
| Example 1-2 | A-2 | 83 | — | 15 | — | — | 2 | — | — | — | — | — | — | — | 1,700 | 7.1 |
| Example 1-3 | A-3 | 80 | — | 15 | — | — | 5 | — | — | — | — | — | — | — | 1,710 | 7.2 |
| Example 1-4 | A-4 | 75 | — | 20 | — | — | 5 | — | — | — | — | — | — | — | 1,720 | 7.4 |
| Example 1-5 | A-5 | 70 | — | 25 | — | — | 5 | — | — | — | — | — | — | — | 1,600 | 7.3 |
| Example 1-6 | A-6 | 65 | — | 30 | — | — | 5 | — | — | — | — | — | — | — | 1,630 | 7.3 |
| Example 1-7 | A-7 | 60 | — | 35 | — | — | 5 | — | — | — | — | — | — | — | 1,670 | 7.0 |
| Example 1-8 | A-8 | 65 | — | 25 | — | — | 10 | — | — | — | — | — | — | — | 1,800 | 6.6 |
| Example 1-9 | A-9 | 55 | — | 25 | — | — | 20 | — | — | — | — | — | — | — | 1,520 | 6.9 |
| Example 1-10 | A-10 | 50 | — | 25 | — | — | 25 | — | — | — | — | — | — | — | 1,510 | 6.9 |
| Example 1-11 | A-11 | 80 | — | 15 | — | — | — | 5 | — | — | — | — | — | — | 2,000 | 7.5 |
| Example 1-12 | A-12 | 75 | — | 15 | — | — | — | — | 10 | — | — | — | — | — | 1,930 | 7.4 |
| Example 1-13 | A-13 | 70 | — | 25 | — | — | — | — | — | 5 | — | — | — | — | 1,600 | 7.0 |
| Example 1-14 | A-14 | 80 | — | 15 | — | — | — | — | — | — | 5 | — | — | — | 1,750 | 7.1 |
| Example 1-15 | A-15 | 80 | — | 15 | — | — | — | — | — | — | — | 5 | — | — | 1,550 | 6.9 |
| Example 1-16 | A-16 | 70 | — | 25 | — | — | — | — | — | — | — | — | 5 | — | 1,860 | 7.3 |
| Example 1-17 | A-17 | 80 | — | 15 | — | — | — | — | — | — | — | — | — | 5 | — | 1,510 | 7.2 |
| Example 1-18 | A-18 | 80 | — | 15 | — | — | — | — | — | — | — | — | — | 5 | 1,940 | 7.8 |
| Example 1-19 | A-19 | 70 | — | — | 25 | — | 5 | — | — | — | — | — | — | — | 1,600 | 7.5 |
| Example 1-20 | A-20 | 70 | 20 | — | — | 5 | 5 | — | — | — | — | — | — | — | 1,560 | 6.9 |
| Example 1-21 | A-21 | 70 | 20 | 5 | — | — | 5 | — | — | — | — | — | — | — | 1,700 | 7.1 |
| Comparative Example 1-1 | AJ-1 | 85 | — | 15 | — | — | — | — | — | — | — | — | — | — | 1,500 | 7.9 |
| Comparative Example 1-2 | AJ-2 | 70 | 25 | — | — | — | 5 | — | — | — | — | — | — | — | 1,750 | 7.0 |

Preparation of Silicon-Containing Composition

The solvent (B) used in preparing each silicon-containing composition is shown below. It is to be noted that in Examples 2-1 to 2-21 and Comparative Examples 2-1 and 2-2 below, unless otherwise specified particularly, the term "parts by mass" means a value, provided that the total mass of the components used was 100 parts by mass.
Solvent (B)
B-1: Propylene Glycol Monoethyl Ether Example 2-1: Preparation of Silicon-Containing Composition (J-1)

Silicon-containing composition (J-1) was prepared by: mixing 1 part by mass (not including the solvent) of (A-1) as the compound (A), and 99 parts by mass (including the solvent contained in the solution of the compound (A)) of (B-1) as the solvent (B); and filtering a resulting solution through a polytetrafluoroethylene filter having a pore size of 0.2 μm.

Examples 2-2 to 2-21, and Comparative Examples 2-1 and 2-2: Preparation of Silicon-Containing Compositions (J-2) to (J-21), (j-1), and 0-2)

Silicon-containing compositions (J-2) to (J-17) of Examples 2-2 to 2-21, and silicon-containing compositions (j-1) and (j-2) of Comparative Examples 2-1 and 2-2 were prepared by a similar operation to that of Example 2-1 except that for each component, the type and the blended amount shown in Table 2 below were used.
Evaluations The compositions prepared as described above were evaluated with regard to resist pattern configuration and film removability with an alkali-liquid by the following methods. The results of the evaluations are shown in Table 2 below.

Resist Pattern Configuration

A material for organic underlayer film formation ("HM8006," available from JSR Corporation) was applied on a 12-inch silicon wafer by spin-coating using a spin-coater ("CLEAN TRACK ACT 12," available from Tokyo Electron Limited), and thereafter heating was conducted at 250° C. for 60 sec to form an organic underlayer film having an average thickness of 100 nm. Each silicon-containing composition prepared as described above was applied on the organic underlayer film, and subjected to heating at 220° C. for 60 sec, followed by cooling at 23° C. for 30 sec to form a silicon-containing film having an average thickness of 20 nm. A radiation-sensitive resin composition ("ARF AR2772JN" available from JSR Corporation) was applied on each silicon-containing film formed as described above, and heating was conducted at 90° C. for 60 sec, followed by cooling at 23° C. for 30 sec to form a resist film having an average thickness of 100 nm. Next, an ArF immersion scanner ("S610C" available from Nikon Corporation) was used to conduct an exposure through a mask with a mask size for forming 40 nm line/80 nm pitch under optical conditions involving NA of 1.30 and Dipole. Subsequently, the substrate was heated at 100° C. for 60 sec, followed by cooling at 23° C. for 60 sec. Thereafter, a development was carried out using n-butyl acetate (20° C. to 25° C.) with a puddle procedure, followed by drying to give a substrate for evaluation having a resist pattern formed thereon. For line-width measurement and observation of the cross-sectional shape of the resist pattern on the substrate for evaluation, a scanning electron microscope ("CG-4000," available from Hitachi High-Technologies Corporation) was used. On the substrate for evaluation, an exposure dose at which a 1:1 line and space pattern with a line width of 40 nm was formed was defined as an optimum exposure dose. The resist pattern configuration was evaluated to be: "A" (favorable) in a case of the cross-sectional shape of the pattern being rectangular; "B" (somewhat favorable) in a case of the cross section of the pattern being accompanied by tailing; or "C" (unfavorable) in a case of a residue (defect) existing on the pattern.

Film Removability

Each silicon-containing composition prepared as described above was applied on a 12-inch silicon wafer, and subjected to heating at 220° C. for 60 sec, followed by cooling at 23° C. for 30 sec to form a silicon-containing film having an average thickness of 20 nm. Each substrate provided with a silicon-containing film thus obtained was immersed for 5 min in a removing liquid (aqueous mixed liquid of 25% by mass aqueous ammonia solution/30% by mass hydrogen peroxide solution/water=1/1/5 (volume ratio)) heated to 65° C., followed by washing with water and drying to give a substrate for evaluation. In addition, each substrate provided with a silicon-containing film thus obtained was immersed for 10 min in a removing liquid (aqueous mixed liquid of 25% by mass aqueous ammonia solution/30% by mass hydrogen peroxide solution/water=1/1/5 (volume ratio)) heated to 65° C., followed by washing with water and drying to give a substrate for evaluation. A cross section of each substrate for evaluation thus obtained was observed using a field emission scanning electron microscope ("SU8220," available from Hitachi High-Technologies Corporation), and was evaluated to be: "A" (favorable) in a case of the silicon-containing film not remaining after being immersed in the removing liquid for 5 min; "B" (somewhat favorable) in a case of the silicon-containing film remaining after being immersed in the removing liquid for 5 min, and the silicon-containing film not remaining after being immersed in the removing liquid for 10 min; or "C" (unfavorable) in a case of the silicon-containing film remaining after being immersed in the removing liquid for 5 min and for 10 min.

As is clear from the results shown in Table 2 above, the silicon-containing films formed from the silicon-containing compositions of the Examples enabled forming thereon a resist pattern that is superior in terms of rectangularity of a cross-sectional shape, as compared with the silicon-containing films formed from the silicon-containing compositions of the Comparative Examples. Furthermore, the silicon-containing films formed from the silicon-containing compositions of the Examples exhibited favorable film removability, as compared with the silicon-containing films formed from the silicon-containing compositions of the Comparative Examples.

The silicon-containing composition and the method of producing a semiconductor substrate of the embodiments of the present invention enable forming a resist pattern that is superior in terms of rectangularity of the cross-sectional shape, and forming an easily removable silicon-containing film. Therefore, these can be suitably used in production of a semiconductor substrate, and the like.

Obviously, numerous modifications and variations of the present invention are possible in light of the above teachings. It is therefore to be understood that within the scope of the appended claims, the invention may be practiced otherwise than as specifically described herein.

What is claimed is:

1. A silicon-containing composition comprising:
   a polysiloxane compound comprising a first structural unit represented by formula (1), and a second structural unit represented by formula (2); and

TABLE 2

| | | (A) Compound | | (B) Solvent | | | |
|---|---|---|---|---|---|---|---|
| | Silicon-containing composition | type | blended amount (parts by mass) | type | blended amount (parts by mass) | Resist pattern configuration | Film removability |
| Example 2-1 | J-1 | A-1 | 1 | B-1 | 99 | A | B |
| Example 2-2 | J-2 | A-2 | 1 | B-1 | 99 | A | A |
| Example 2-3 | J-3 | A-3 | 1 | B-1 | 99 | A | A |
| Example 2-4 | J-4 | A-4 | 1 | B-1 | 99 | A | A |
| Example 2-5 | J-5 | A-5 | 1 | B-1 | 99 | A | A |
| Example 2-6 | J-6 | A-6 | 1 | B-1 | 99 | A | A |
| Example 2-7 | J-7 | A-7 | 1 | B-1 | 99 | B | A |
| Example 2-8 | J-8 | A-8 | 1 | B-1 | 99 | A | A |
| Example 2-9 | J-9 | A-9 | 1 | B-1 | 99 | A | A |
| Example 2-10 | J-10 | A-10 | 1 | B-1 | 99 | B | A |
| Example 2-11 | J-11 | A-11 | 1 | B-1 | 99 | A | A |
| Example 2-12 | J-12 | A-12 | 1 | B-1 | 99 | A | A |
| Example 2-13 | J-13 | A-13 | 1 | B-1 | 99 | A | A |
| Example 2-14 | J-14 | A-14 | 1 | B-1 | 99 | A | A |
| Example 2-15 | J-15 | A-15 | 1 | B-1 | 99 | A | B |
| Example 2-16 | J-16 | A-16 | 1 | B-1 | 99 | A | B |
| Example 2-17 | J-17 | A-17 | 1 | B-1 | 99 | A | B |
| Example 2-18 | J-18 | A-18 | 1 | B-1 | 99 | A | B |
| Example 2-19 | J-19 | A-19 | 1 | B-1 | 99 | A | A |
| Example 2-20 | J-20 | A-20 | 1 | B-1 | 99 | B | A |
| Example 2-21 | J-21 | A-21 | 1 | B-1 | 99 | B | A |
| Comparative Example 2-1 | j-1 | AJ-1 | 1 | B-1 | 99 | A | C |
| Comparative Example 2-2 | j-2 | AJ-2 | 1 | B-1 | 99 | C | A | a solvent:

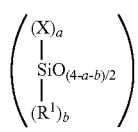 (1)

wherein,
in the formula (1), X represents an aromatic hydrocarbon group having 1 to 20 carbon atoms and comprising a substituent which comprises a fluorine atom; a is an integer of 1 to 3, wherein in a case in which a is no less than 2, a plurality of Xs are identical or different from each other; $R^1$ represents a halogen atom, a hydroxy group, or a monovalent organic group having 1 to 20 carbon atoms; and b is an integer of 0 to 2, wherein in a case in which b is 2, two $R^1$s are identical or different from each other, and wherein a sum of a and b is no greater than 3, and

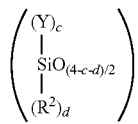 (2)

in the formula (2), Y represents a monovalent organic group having 1 to 20 carbon atoms and represented by formula (3-1), formula (3-3), or formula (3-4); c is an integer of 1 to 3, wherein in a case in which c is no less than 2, a plurality of Ys are identical or different from each other; $R^2$ represents a halogen atom, a hydroxy group, or a monovalent organic group having 1 to 20 carbon atoms; and d is an integer of 0 to 2, wherein in a case in which d is 2, two $R^2$s are identical or different from each other, and wherein a sum of c and d is no greater than 3:

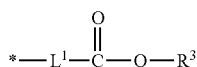 (3-1)

wherein, in the formula (3-1), $L^1$ represents a single bond, a divalent hydrocarbon group having 1 to 10 carbon atoms, or a group in which a heteroatom is included between adjacent carbon atoms of a divalent hydrocarbon group having 1 to 10 carbon atoms; $R^3$ represents a monovalent hydrocarbon group having 1 to 10 carbon atoms; and * denotes a site bonding to the silicon atom in the formula (2),

 *-$L^3$-$R^5$ (3-3)

in the formula (3-3), $L^3$ represents a single bond or a divalent linking group; $R^5$ represents a monovalent group having a lactone structure; and * denotes a site bonding to the silicon atom in the formula (2),

 *-$L^4$-$R^6$ (3-4)

in the formula (3-4), $L^4$ represents a single bond or a divalent linking group; $R^6$ represents a monovalent group having a cyclic carbonate structure; and * denotes a site bonding to the silicon atom in the formula (2).

2. The silicon-containing composition according to claim 1, wherein the polysiloxane compound further comprises a third structural unit represented by formula (4):

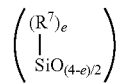 (4)

wherein, in the formula (4), $R^7$ represents a halogen atom, a hydroxy group, or a monovalent organic group having 1 to 20 carbon atoms; and e is an integer of 1 to 3, wherein in a case in which e is no less than 2, a plurality of $R^7$s are identical or different from each other.

3. The silicon-containing composition according to claim 1, wherein the polysiloxane compound further comprises a fourth structural unit represented by formula (5):

 ($SiO_{4/2}$) (5).

4. The silicon-containing composition according to claim 1, wherein a proportion of the first structural unit with respect to total structural units constituting the polysiloxane compound is no less than 1 mol % and no greater than 40 mol %.

5. The silicon-containing composition according to claim 1, wherein a proportion of the second structural unit with respect to total structural units constituting the polysiloxane compound is no less than 1 mol % and no greater than 20 mol %.

6. A method of producing a semiconductor substrate, the method comprising:
applying the silicon-containing composition according to claim 1 directly or indirectly on a substrate to form a silicon-containing film;
applying a composition for resist film formation directly or indirectly on the silicon-containing film to form a resist film;
exposing the resist film to a radioactive ray; and
developing with an organic solvent, the resist film exposed.

7. The method according to claim 6, further comprising before the applying of the silicon-containing composition,
forming an organic underlayer film directly or indirectly on the substrate.

8. The method according to claim 6, further comprising after the applying of the silicon-containing composition,
removing the silicon-containing film with a removing liquid comprising a base.

9. The method according to claim 8, wherein
the removing liquid is a liquid comprising a base and water, or a liquid comprising a base, hydrogen peroxide, and water.

10. The method according to claim 6, wherein the polysiloxane compound further comprises a third structural unit represented by formula (4):

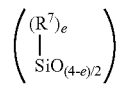 (4)

wherein, in the formula (4), $R^7$ represents a halogen atom, a hydroxy group, or a monovalent organic group having 1 to 20 carbon atoms; and e is an integer of 1 to 3, wherein in a case in which e is no less than 2, a plurality of R⁷s are identical or different from each other.

11. The method according to claim 6, wherein the polysiloxane compound further comprises a fourth structural unit represented by formula (5):

(SiO$_{4/2}$)    (5).

12. The method according to claim 6, wherein a proportion of the first structural unit with respect to total structural units constituting the polysiloxane compound is no less than 1 mol % and no greater than 40 mol %.

13. The method according to claim 6, wherein a proportion of the second structural unit with respect to total structural units constituting the polysiloxane compound is no less than 1 mol % and no greater than 20 mol %.

14. The silicon-containing composition according to claim 1, wherein in the formula (2), Y is represented by formula (3-1), and in the formula (3-1), $R^3$ is a group that bonds to the ethereal oxygen atom of the carbonyloxy group in the formula (3-1) at a tertiary carbon atom.

15. The silicon-containing composition according to claim 1, wherein in the formula (2), Y is represented by formula (3-3), and in the formula (3-3), $L^3$ represents a single bond, a divalent hydrocarbon group having 1 to 10 carbon atoms, or a group in which a heteroatom is included between adjacent carbon atoms of a divalent hydrocarbon group having 1 to 10 carbon atoms.

16. The silicon-containing composition according to claim 1, wherein in the formula (2), Y is represented by formula (3-4), and in the formula (3-4), $L^4$ represents a single bond, a divalent hydrocarbon group having 1 to 10 carbon atoms, or a group in which a heteroatom is included between adjacent carbon atoms of a divalent hydrocarbon group having 1 to 10 carbon atoms.

17. The method according to claim 6, wherein in the formula (2), Y is represented by formula (3-1), and in the formula (3-1), $R^3$ is a group that bonds to the ethereal oxygen atom of the carbonyloxy group in the formula (3-1) at a tertiary carbon atom.

18. The method according to claim 6, wherein in the formula (2), Y is represented by formula (3-3), and in the formula (3-3), $L^3$ represents a single bond, a divalent hydrocarbon group having 1 to 10 carbon atoms, or a group in which a heteroatom is included between adjacent carbon atoms of a divalent hydrocarbon group having 1 to 10 carbon atoms.

19. The method according to claim 6, wherein in the formula (2), Y is represented by formula (3-4), and in the formula (3-4), $L^4$ represents a single bond, a divalent hydrocarbon group having 1 to 10 carbon atoms, or a group in which a heteroatom is included between adjacent carbon atoms of a divalent hydrocarbon group having 1 to 10 carbon atoms.

* * * * *